(12) United States Patent
Nandakumar

(10) Patent No.: US 11,581,399 B2
(45) Date of Patent: Feb. 14, 2023

(54) GATE IMPLANT FOR REDUCED RESISTANCE TEMPERATURE COEFFICIENT VARIABILITY

(71) Applicant: TEXAS INSTRUMENTS INCORPORATED, Dallas, TX (US)

(72) Inventor: Mahalingam Nandakumar, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/917,293

(22) Filed: Jun. 30, 2020

(65) Prior Publication Data

US 2021/0408221 A1 Dec. 30, 2021

(51) Int. Cl.
*H01L 27/07* (2006.01)
*H01L 49/02* (2006.01)
*H01L 21/8238* (2006.01)

(52) U.S. Cl.
CPC ...... *H01L 28/20* (2013.01); *H01L 21/823857* (2013.01); *H01L 27/0738* (2013.01)

(58) Field of Classification Search
CPC ............. H01L 27/101; H01L 27/0802; H01L 27/0711–0727; H01L 27/0635; H01L 27/0783–0794; H01L 27/0772; H01L 27/075–0755; H01L 27/067–0682; H01L 27/0647–0652; H01L 29/7304; H01L 27/0738; H01L 27/0629; H01L 29/8605; H01L 28/20–26
See application file for complete search history.

(56) References Cited

U.S. PATENT DOCUMENTS 4,296,428 A * 10/1981 Haraszti ............ H01L 21/76264
257/331
5,330,930 A 7/1994 Chi
6,072,220 A * 6/2000 Strack ................. H01L 29/8605
257/379
(Continued)

FOREIGN PATENT DOCUMENTS

EP 0521678 A1 1/1993
RU 2611552 C2 2/2017
(Continued)

OTHER PUBLICATIONS

Search Report, Application No. PCT/US 2021/038222, dated Sep. 23, 2021.

*Primary Examiner* — Jarrett J Stark
(74) *Attorney, Agent, or Firm* — Andrew R. Ralston; Frank D. Cimino

(57) ABSTRACT

Methods and semiconductor circuits are described in which a polysilicon resistor body is formed over a semiconductor substrate. A first dopant species is implanted into the polysilicon resistor body at a first angle about parallel to a surface normal of a topmost surface of the polysilicon resistor body. A second dopant species is implanted into the polysilicon resistor body at a second angle greater than about 10° relative to the surface normal. The combination of implants reduces the different between the temperature coefficient (tempco) of resistance of narrow resistors relative to the tempco of wide resistors, and brings the tempco of the resistors closer to a preferred value of zero.

13 Claims, 11 Drawing Sheets

(56) References Cited

U.S. PATENT DOCUMENTS

| | | | |
|---|---|---|---|
| 7,074,656 B2 * | 7/2006 | Yeo | H01L 21/26586 |
| | | | 257/E21.345 |
| 7,208,330 B2 | 4/2007 | Collins et al. | |
| 8,816,436 B2 * | 8/2014 | Cheng | H01L 21/845 |
| | | | 257/350 |
| 8,927,385 B2 | 1/2015 | Nandakumar et al. | |
| 9,704,966 B1 * | 7/2017 | Singh | H01L 29/0657 |
| 9,812,444 B2 * | 11/2017 | Hu | H01L 21/2053 |
| 9,954,050 B1 * | 4/2018 | Adusumilli | H01L 21/02697 |
| 2003/0141569 A1 * | 7/2003 | Fried | H01L 29/0657 |
| | | | 257/536 |
| 2013/0149849 A1 | 6/2013 | Nandakumar | |
| 2018/0247925 A1 | 8/2018 | Salman et al. | |

FOREIGN PATENT DOCUMENTS

| | | |
|---|---|---|
| RU | 2648295 C1 | 3/2018 |
| WO | 2006036751 A2 | 4/2006 |

\* cited by examiner

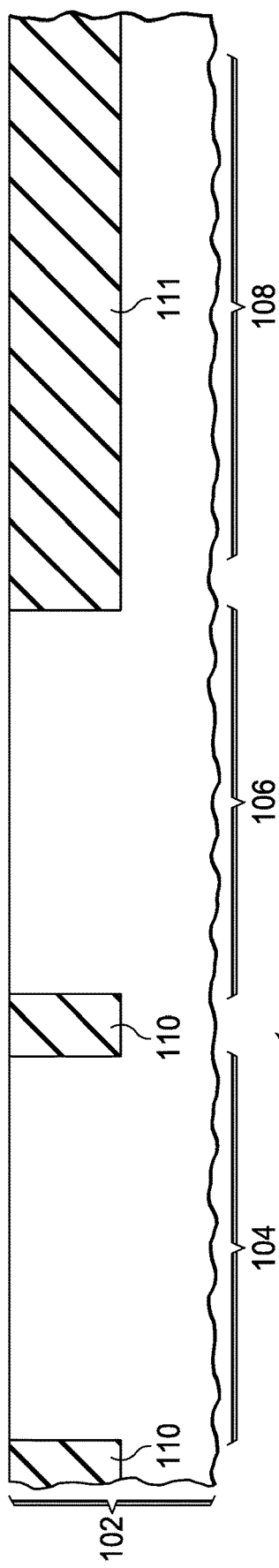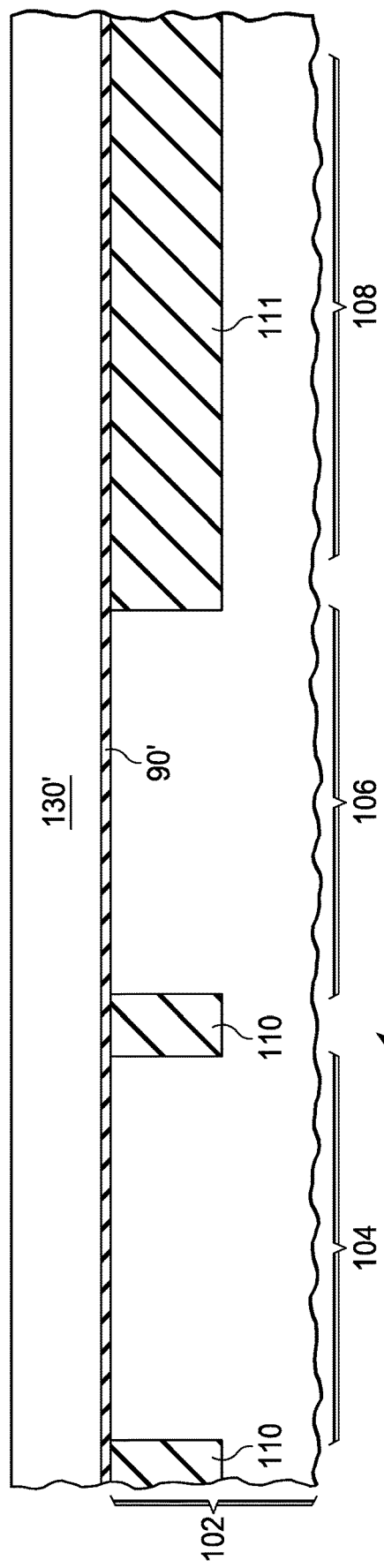

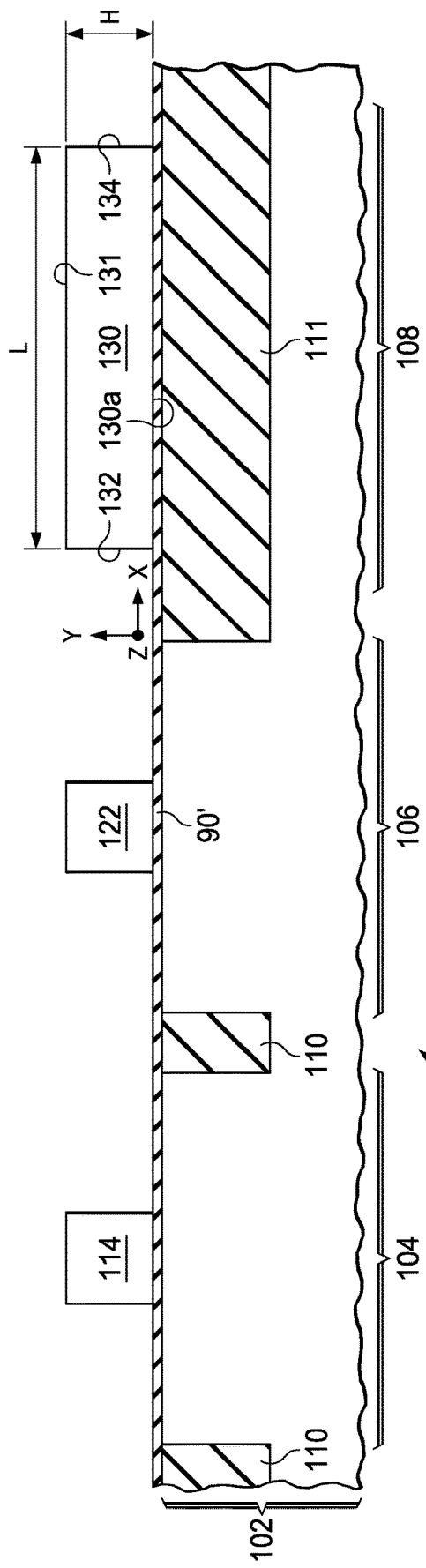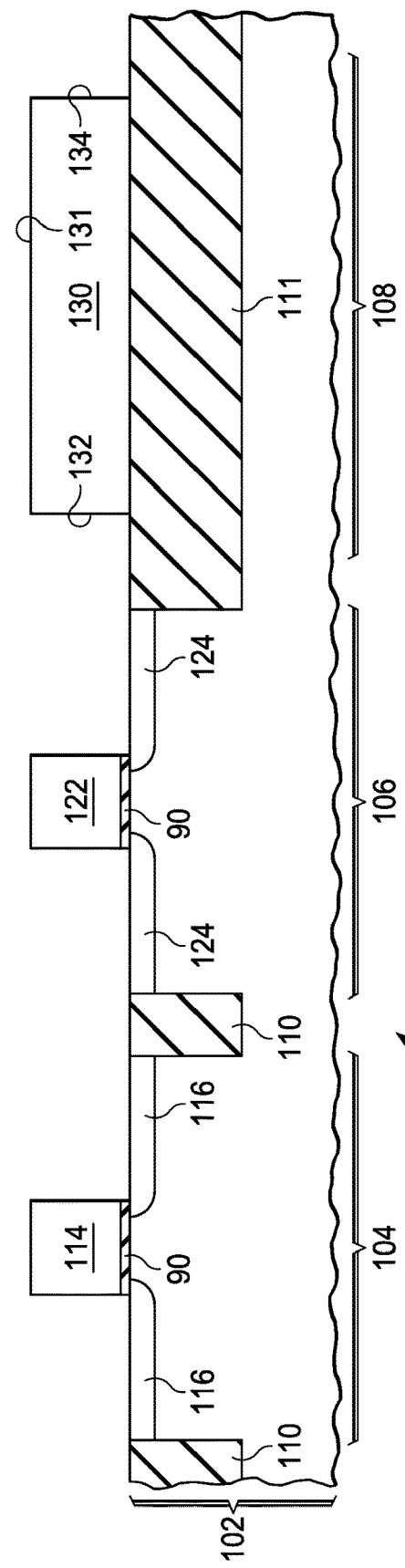
FIG. 3
FIG. 4

US 11,581,399 B2

GATE IMPLANT FOR REDUCED RESISTANCE TEMPERATURE COEFFICIENT VARIABILITY

FIELD OF THE INVENTION

This disclosure relates to the field of integrated circuits. More particularly, but not exclusively, this disclosure relates to resistors, e.g. zero temperature coefficient of resistance (ZTCR) resistors in integrated circuits.

BACKGROUND

Resistors in integrated circuits fabricated using advanced technology nodes suffer from increased variability at smaller linewidths due to limitations in lithography/etch/implant processes and dopant loss. The dopant loss may in turn lead to changes in the temperature coefficient of resistance. The variability in resistance and temperature coefficient can adversely impact circuit functionality and result in a yield loss especially at process corners.

SUMMARY

An aspect of the present disclosure relates to an integrated device having a more uniform temperature coefficient of resistance of resistors across a wafer and/or between wafers by varying the angle of an implant and/or increasing or decreasing the energy level of the implant. An additional aspect of the present disclosure relates to an improved method of reducing variability in the ion implantation profile and improving the temperature coefficient profile.

BRIEF DESCRIPTION OF THE DRAWINGS

For a detailed description of various examples, reference will now be made to the accompanying drawings in which:

FIG. 1 illustrates a substrate having field oxides formed therein.

FIG. 2 illustrates an intermediate structure having a polysilicon deposited over the substrate.

FIG. 3 illustrates an intermediate structure having gates and at least one polysilicon resistor body formed over the substrate.

FIG. 4 illustrates an intermediate structure having lightly doped regions formed within and over the substrate.

DETAILED DESCRIPTION

Figure 5A:
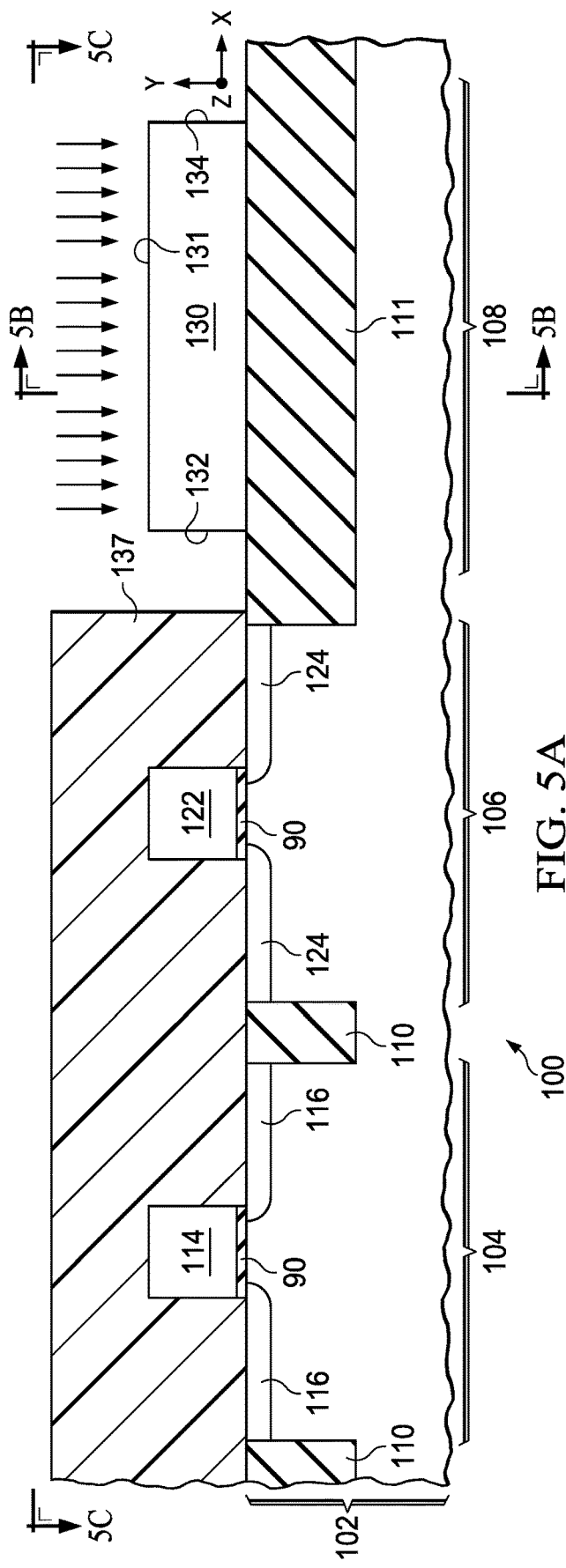
FIGS. 5A-5C illustrate an intermediate structure with dopant that is implanted at a zero-degree and/or non-zero-degree angle relative to a surface normal.

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to." Also, the term "couple" or "couples" is intended to mean either an indirect or direct wired or wireless connection. Thus, if a first device couples to a second device, that connection may be through a direct connection or through an indirect connection via other devices and connections.

Aspects of the disclosure relate generally to integrated semiconductor devices having resistors and/or MOS transistors having improved cross-wafer ion implantation uniformity that reduces variability of associated temperature coefficient profiles. In various examples such improved uniformity can be achieved by varying the angle and/or the energy level of ion implantation during manufacture.

Referring to FIG. 1, the integrated circuit 100 is formed in and on a semiconductor substrate 102, for example a semiconductor material, silicon wafer, silicon-on-insulator (SOI) wafer, hybrid orientation technology (HOT) wafer, or other substrate suitable for fabrication of the integrated circuit 100. The integrated circuit 100 includes an n-channel metal oxide semiconductor (NMOS) area 104 for an NMOS transistor, a PMOS area 106 for a PMOS transistor, and a ZTCR area 108 for a ZTCR (zero temperature coefficient of resistance) resistor. Field oxides 110, for example formed by a shallow trench isolation (STI) process, may laterally isolate the NMOS area 104 and the PMOS area 106 from adjacent portions of the integrated circuit 100. Field oxide 111, which may also be formed by an STI process, may be located in the ZTCR area 108.

An STI process may include the steps of: forming an oxide layer on the substrate 102, forming a silicon nitride layer on the oxide layer, patterning the silicon nitride layer so as to expose an area for the field oxide 110 and 111, etching a trench in the substrate 102 in the exposed area to an appropriate depth for a desired thickness of the field oxide 110, 111, growing a layer of thermal oxide on sidewalls and a bottom of the trench, filling the trench with silicon dioxide by chemical vapor deposition (CVD), high density plasma (HDP) or high aspect ratio process (HARP), removing unwanted silicon dioxide from a top surface of the silicon nitride layer, and removing the silicon nitride layer.

FIG. 2 illustrates the integrated circuit 100 after formation of a gate oxide precursor layer 90' over the substrate. FIG. 2 also illustrates a polysilicon precursor layer 130' formed over the gate oxide precursor layer 90'. The illustration is not intended to be limiting. A person of ordinary skill in the art will recognize that several material layers can be included in the integrated circuit 100 without departing from the spirit of the disclosure. Some material layers not germane to the described examples are omitted for the sake of clarity and brevity.

FIG. 3 illustrates a polysilicon resistor body 130 created by the selective removal of portions of the polysilicon layer 130' (FIG. 2). Coordinate axes are shown as a reference and include an x-axis parallel to the surface of the substrate 102, a y-axis normal to the surface of the substrate 102, and a z-axis normal to the plane of the drawing. The y-axis is a surface normal of the substrate 102. As shown, the polysilicon resistor body 130 has a first face 130a (bottom-most surface) that is proximate to, or touches, the field oxide 111. The polysilicon resistor body 130 has a second face 131 that is opposite the first face 130a, the second face 131 referred to hereinafter as the topmost surface 131. The polysilicon resistor body 130 has a length L parallel to the x-axis and a height H parallel to the y-axis, as shown in FIG. 3. The height is measured from the first face 103a to the topmost surface 131. The length L is measured along a distance parallel to the x-axis between distal portions 132 and 134. The polysilicon resistor body 130 has a width W measured along a distance parallel to the z-axis between sidewall portions 133 and 135 (see FIG. 5B, which is a cross-sectional view taken along length L of the polysilicon resistor body 130).

The removal of the portions of the polysilicon layer 130' (FIG. 2) to form the FIG. 3 structure can be performed by selective patterning and etching. It should be noted that other polysilicon bodies can be formed together with the polysilicon resistor body 130 from the polysilicon layer 130', and that the description provided herein is not intended to be limiting. For example, as illustrated in FIG. 3, a polysilicon gate 114 can be formed over the NMOS area 104, and a polysilicon gate 122 can be formed over the PMOS area 106. Both polysilicon gates 114, 122 are formed over respective gate dielectrics 112, 120. In some other examples the polysilicon gates 114, 122 may be replaced by metal oxide gates (not shown).

FIG. 4 illustrates the integrated circuit 100 after formation of doped regions including n-type lightly doped drain (NLDD) regions 116 in the NMOS area 104 and p-type lightly doped drain (PLDD) regions 124 in the PMOS area 106. As illustrated, the gate oxide precursor layer 90' (FIG. 3) is processed as known in the art to form a gate oxide 90 between each gate 114, 122 and the respective active region of the integrated circuit 100. The gate oxide precursor layer (FIG. 3) over the field oxides 110, 111 can form top portions of, or be incorporated into, those field oxides 110, 111. As illustrated, a person of ordinary skill in the art would recognize that the polysilicon resistor body 130 formed over the field oxide 111 can be in contact with the gate oxide material that has merged with or formed part of the top portions of field oxide 111.

Figure 5B:
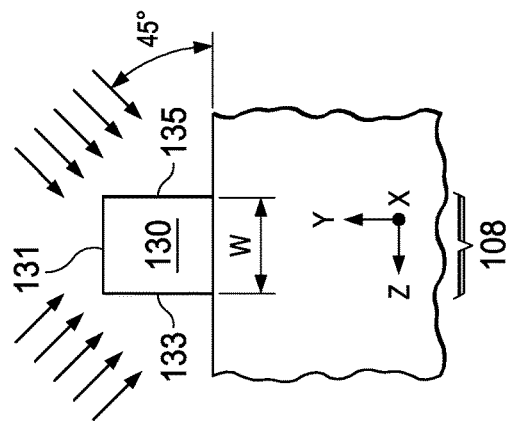
Figure 5C:
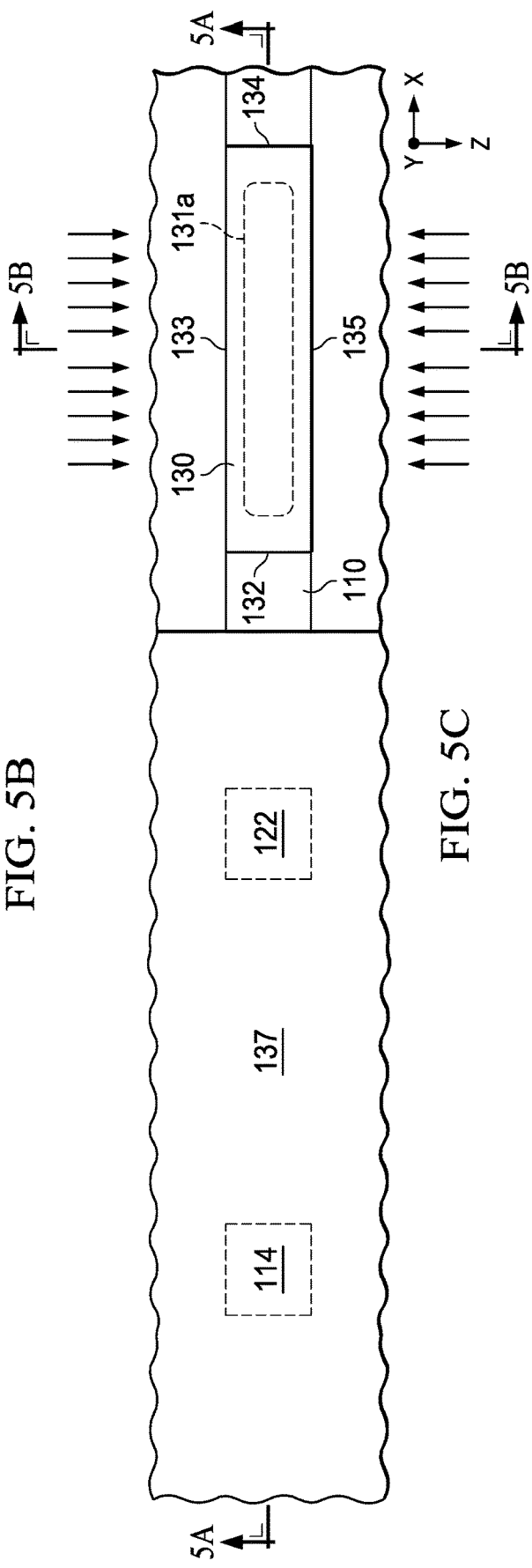

FIGS. 5A-5C illustrate the implantation of ions, such as, for example, boron, into the polysilicon resistor body 130, according to various examples. As illustrated in FIG. 5A, a first ion implantation is performed by directing the ion flux at substantially zero degrees relative to the surface normal of the topmost surface 131 (e.g., a direction perpendicular to the topmost surface 131 and substantially parallel to the y-axis on the coordinate axes depicted).

FIG. 5B illustrates a second ion implantation process wherein ions are implanted at a non-zero-degree angle relative to the surface normal (e.g., in a direction other than perpendicular to the topmost surface 131). As illustrated, the second ion implantation process is at a non-zero-degree angle to the surface normal (Y axis) and directed towards a first sidewall portion 133 and a second sidewall portion 135 (e.g., opposite sides of the polysilicon resistor body 130 as measured by its width W). The non-zero-degree angle relative to the surface normal may be in a range from about 1° to about 90° relative to the surface normal. In some cases it is thought that a non-zero-degree angle of at least 3° will sufficiently implant dopants in the sidewall portions to achieve the described benefits, while in some cases a minimum angle of about 10° may be effective. Such minima may be a function of the minimum linewidth of the polysilicon resistor bodies in a particular design layout. As illustrated in FIG. 5B, the non-zero-degree angle is about 45°. Those skilled in the pertinent art will appreciate that the implant angle may have a minimum tolerance, e.g. about 0.1°. As such, the non-zero-degree angle can vary by 0.1°. As illustrated in FIG. 5C, which is a partial top-down view of the polysilicon resistor body 130 as illustrated in FIG. 5A, the implant direction is shown to be directed towards the first and second sidewall regions 133, 135, respectively, of the polysilicon resistor body 130.

It should be noted that the description is not intended to be limiting. For example, while FIGS. 5A-5C depict the zero-degree angle and non-zero-degree angle ion implantations as two processes, it should be understood to a person of ordinary skill in the art that the step could be performed simultaneously with two or more implanters and at different angles. Moreover, the zero-degree angle and non-zero-degree angle implantations could be performed in more than two processes. For example, the zero-degree angle ion implantation may be followed by a non-zero-degree angle ion implantation step that is directed to the first sidewall portion 133 of the polysilicon resistor body 130 at a first angle, which is subsequently followed by another ion non-zero-degree angle ion implantation that is directed to a second sidewall portion 135 of the polysilicon resistor body 130 at a second angle that is different from the first angle. As discussed above, while the angle of the ion implantation shown in FIG. 5B appears to be 45° relative to the surface normal of the topmost surface 131, it could be as little as about 1° to as much as about 90° relative to the surface normal. The limiting factor may be the separation between the polysilicon lines on a wafer; for example, a 100 nm separation between lines would allow for a 45° non-zero-degree angle implantation of the surface normal (FIG. 5B), while a larger separation would allow for a non-zero-degree angle of greater than 45° and a smaller separation would require a non-zero-degree angle of less than 45°. As a result, the non-zero-degree angle could be in the range of about 10° to about 30°, from about 30° to about 60°, and from about 60° to about 90°. In addition, the non-zero-degree angle could be about 25°, about 45°, or about 65°.

In addition, it should be noted that the angled ion implantation step could take place at a variety of angles depending on the desired application. In addition, and for example, the dose of the ion implantation may be $5\times10^{13}$ $cm^{-2}$ to $1\times10^{16}$ $cm^{-2}$ In addition, and for example, because the ion implantation is focused on the surface normal of the topmost surface 131 and the sidewall portions 133 and 135, distal portions 132 and 134 (FIGS. 5A and 5C) have a different doping profile than the topmost surface 131 and the sidewall portions 133 and 135 of the polysilicon resistor body 130. The distal portions 132 and 134 are located under or near metal silicide 172 contacts (shown in FIG. 9) and are located distally (or outwardly) from a center region 131a of the topmost surface 131. The implant can be tailored such that the surface normal topmost surface 131 could have a first dopant concentration, the distal portions 132 and 134 could have a second dopant concentration, and the sidewall portions 133 and 135 could have a third dopant concentration. As disclosed herein, the distal portions 132 and 134 have a dopant concentration that is less than that of the topmost surface 131 and the sidewall portions 133 and 135. The topmost surface 131 and the sidewall portions 133 and 135 could be the same or different, depending on the application.

FIGS. 5A and 5C also illustrate the NMOS area 104 and PMOS area 106 optionally covered with a mask 137. Optionally, other features of the FIG. 5A-5C structures could also be ion implanted either simultaneously or separately from the polysilicon resistor body 130. For example, ion implantation of the PMOS area 106 and polysilicon gate 122 could occur either simultaneously or separately from the ion implantation of the polysilicon resistor body 130. In the nonlimiting example of FIG. 5C, an opening in the mask 137 exposes the polysilicon gate 122 to the dopant flux while the mask 137 remains over and protects the NMOS area 104.

In addition, and optionally, the polysilicon resistor body 130 is at least partially co-implanted (for example, with nitrogen, silicon, and indium) as a pre-amorphization implant (PAI) step that can control grain size, reduce ion channeling, and reduce dopant loss. The co-implant can be performed either before or after doping, as discussed below.

Referring back to FIGS. 5A-5C, the angled ion implantation step adds more dopant per unit width to narrower lines relative to the wider lines thereby compensating for dopant loss that could occur on narrower lines during thermal processes (anneal/oxidation steps). The angled implant thus allows for more uniform doping profile across linewidth thereby reducing variability in temperature coefficient of resistance on different linewidth resistors that could be used in the circuit. This more uniform implantation profile can be achieved by varying the angle and/or the dose of the ion implantation step during manufacture of multiple integrated circuits on a single wafer. Polysilicon thickness and linewidth vary across the wafer and from wafer to wafer and are measured inline in the manufacturing process before the resistor implant is done (see, e.g., FIG. 11 infra). The resistor implant dosing regimen can then be tailored to each specific wafer based on measured polysilicon thickness and linewidth. The dosing can be varied across the wafer and wafer-to-wafer to achieve a more uniform resistance and temperature coefficient profile. For example, the dosing of narrower polysilicon lines can be different from wider polysilicon lines on a single wafer or from wafer to wafer in the manufacturing process of multiple semiconductor devices by changing the angle and/or increasing or decreasing the energy level of the implant. This allows tailoring the amount and depth of dopant on the sidewall regions for each line on the wafer or between wafers. For example, it has been found that further processing steps of semiconductor devices on a wafer can lead to the loss of dopant on the sidewall regions and thereby increase the variability of the temperature coefficient of resistance between resistors. By tailoring the angle and/or the energy level of the implant to the width or thickness of the polysilicon resistor bodies, the temperature coefficients of resistance of the resistors across a wafer or between wafers is more uniform, leading to reduced costs. This is particularly relevant to narrower polysilicon lines less than 100 nm wide; because the surface to volume increases as lines are narrower, they are more prone to dopant loss during further processing.

Figure 6:
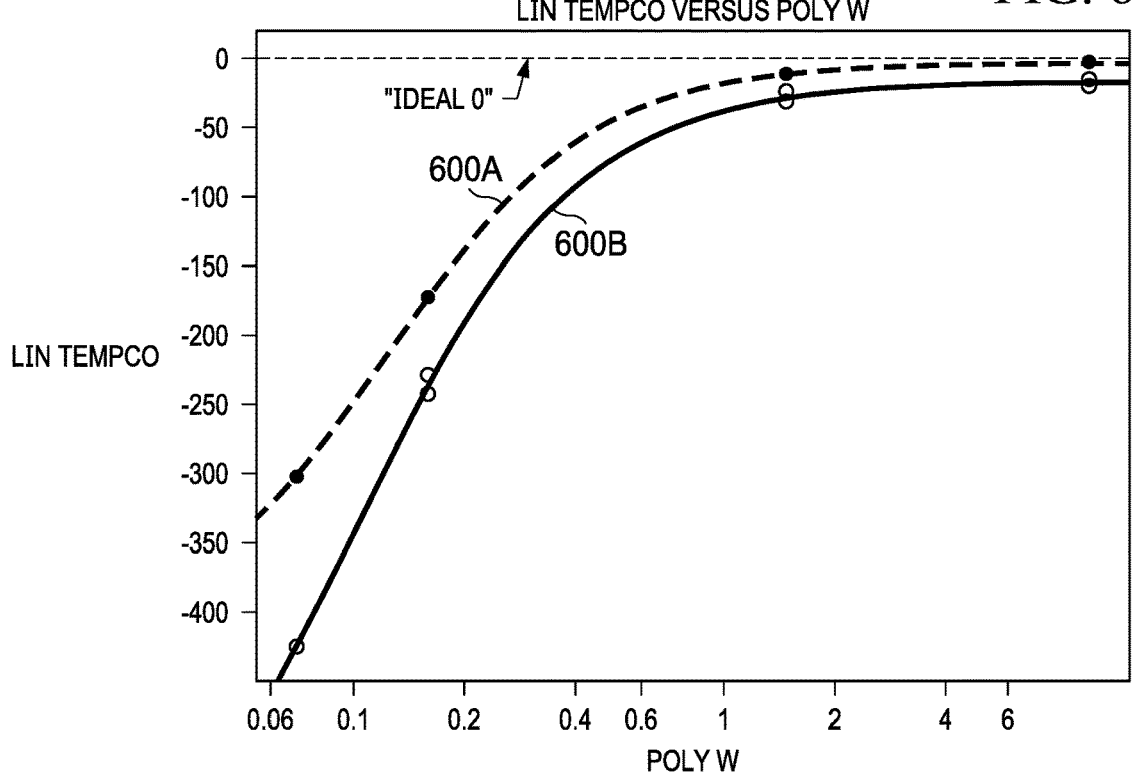
FIG. 6 illustrates the effect on temperature coefficient of zero-degree and non-zero-degree implant.

As illustrated in FIG. 6, the temperature coefficient is greatly improved by non-zero-degree angle ion implantation. The top curve 600A displaying experimental data shows the temperature coefficient profile of lines of varying width that were treated with a non-zero-degree angle implantation only at a 25° angle relative to the surface normal (parallel to the Y axis of FIG. 5B) of the topmost surface 131 (FIG. 5B). The bottom curve 600B shows the temperature coefficient profile of lines of varying width having a zero-degree angle implantation only. As illustrated, the non-zero-degree angle ion implantation has an improved temperature coefficient profile as compared with the zero-degree angle ion implantation. Without being bound by theory, the decrease in the temperature coefficient of narrower lines (e.g., less than 600 nm) is due to the dopant loss on the sidewall regions of the polysilicon resistor bodies, as discussed above.

Figure 7A:
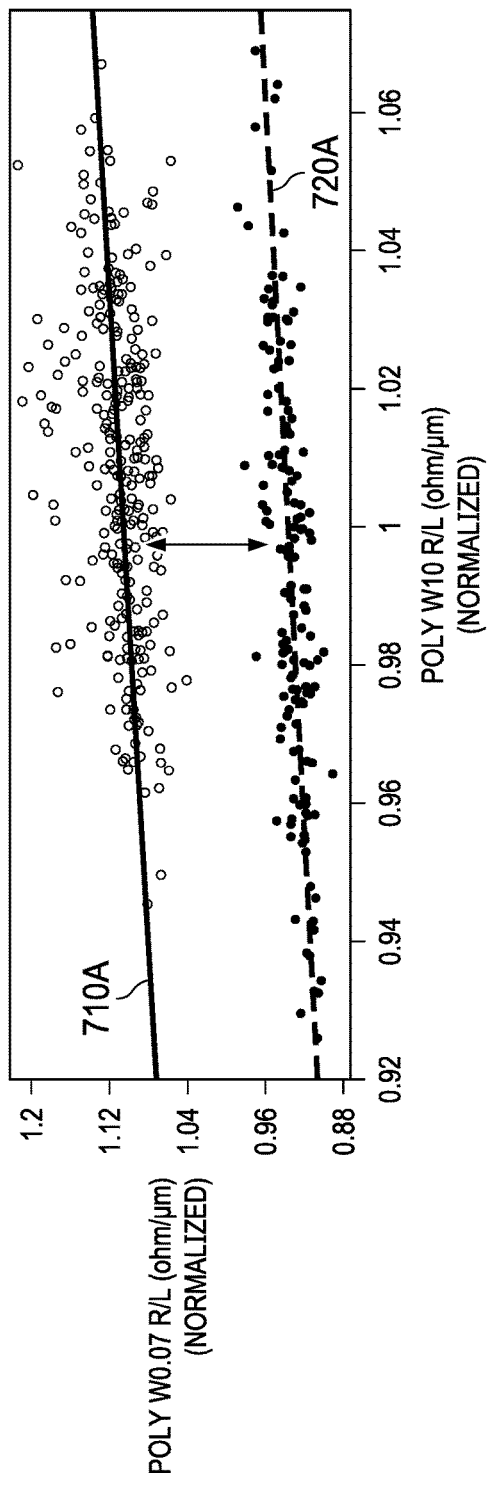
FIGS. 7A and 7B illustrate the effect on relative resistance of narrow lines having undergone zero-degree and non-zero-degree implant.

FIG. 7A illustrates the variance of the resistance of a narrow 70 nm line relative to wider 10 μm line having a zero-degree implantation only (710A) and having a non-zero-degree angle implantation only at a 25° angle (720A) relative to the surface normal (e.g., the Y-axis of FIG. 5B). As shown, there is inherent variability in the resistance of the polysilicon lines due to variations in linewidth, height and angle caused by the polysilicon pattern and etch process. A combination of zero and non-zero-degree angle implantation (as disclosed herein) can be used to adjust for wafer-to-wafer variability. In other words, if the polysilicon linewidth is narrower on a certain wafer (as compared to target value) or narrower on a certain portion of the same wafer (as compared to another portion of that wafer), combination of zero and non-zero-degree angle implantation can be implemented to fine tune the resistance of the narrower line to the desired resistance. For example, by using a combination of zero degree and non-degree implantation (as disclosed herein), the normalized resistance of the narrow line can be made close to 1 (in FIG. 7A) on each wafer or on a single wafer. As illustrated in FIG. 7A, the double-headed arrow shows the range within which the resistance can be tailored for reduced variation in the resistance across multiple wafers or across a single wafer. As known in the art, the linewidth can be determined by a system having a detection system that includes a scatterometer designed to measure the profile of the polysilicon resistor body 130 (FIGS. 5A-5C). Such systems and scatterometers are taught by U.S. Pat. No. 7,208,330 (Collins, et al.), incorporated herein by reference in its entirety.

Figure 7B:
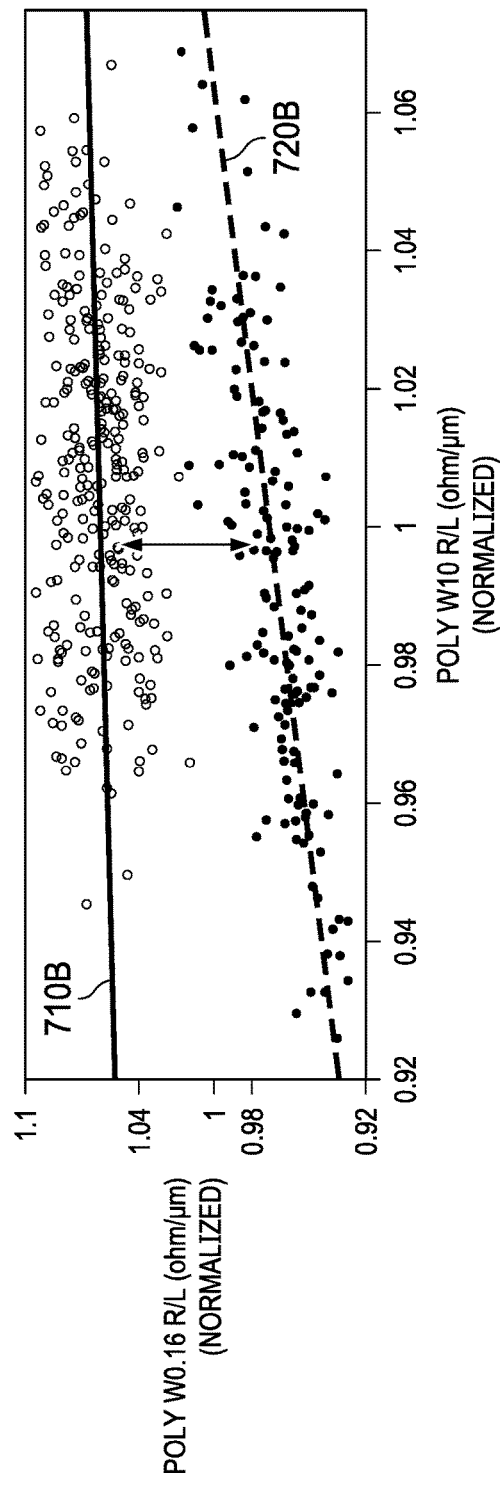

Similarly, FIG. 7B illustrates the variance of the resistance of a 160 nm line relative to a 10 μm wide line having a zero-degree implantation only (710B) and having a non-zero-degree angle implantation only at a 25° angle (720B) relative to the surface normal (e.g., the Y axis of FIG. 5B). As shown, there is inherent variability in the resistance caused by variation on polysilicon profile (linewidth, height and angle). As discussed above with respect to FIG. 7A, a combination of zero and non-zero-degree angle implantation can be used to adjust the resistance for wafer-to-wafer variability and variability within a single wafer. In other words, if the polysilicon linewidth is wider on a certain wafer (compared to target value) or wider on a certain portion of the same wafer (as compared to another portion of that wafer), the amount of non-zero-degree angle implantation can be decreased to fine tune the resistance of the wider line to the desired resistance. For example, by using a combination of zero degree and non-degree implantation as disclosed herein, the normalized resistance of the 160 nm line can be made close to unity (normalized on FIG. 7B) as possible. As illustrated in FIG. 7B, the double-headed arrow shows the range within which the resistance can be tailored for reduced variation in the resistance across multiple wafers. As discussed above, the linewidth can be determined by a system having a detection system that includes a scatterometer designed to measure the profile of the polysilicon resistor body 130 (FIGS. 5A-5C) as taught by U.S. Pat. No. 7,208,330 supra.

The above examples are not intended to be limiting. Both the wide and narrow resistors can share the same combination of zero and angled implant. For the wide resistor, the impact of zero-degree implant is expected to be about the same. However the non-zero-degree implant impacts the resistance of the narrow resistor increasingly as the volume proportion of the line associated with the sidewalls increases with decreasing width. (See, e.g., FIG. 6 showing the separation of curves 600A and 600B in the narrower linewidth range). Hence, the ratio of zero and angled implant can be adjusted to give the same wide device resistance while preferentially tuning the narrow resistor to hit target. Both the energy and angle of the non-zero angle implant can be adjusted to achieve the desired level of adjustment for a range of resistor widths while keeping the wide resistor the same. For example, in FIGS. 7A and 7B, the energy and angle of the non-zero angle implant can be adjusted so that both the 70 nm and the 160 nm resistors hit target while keeping the 10 μm wide resistor the same.

Figure 8A:
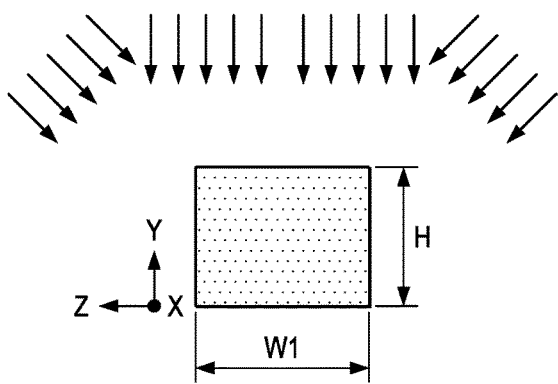
FIGS. 8A-8D illustrate a further embodiment of an intermediate structure with dopant that is implanted at a zero-degree and/or non-zero-degree angle relative to a surface normal.
Figure 8B:
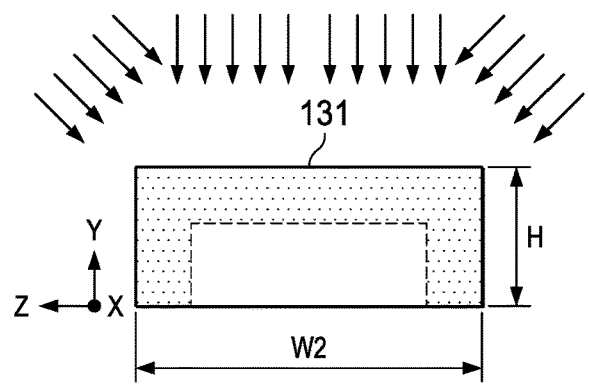
Figure 8C:
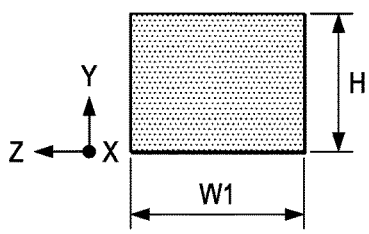
Figure 8D:
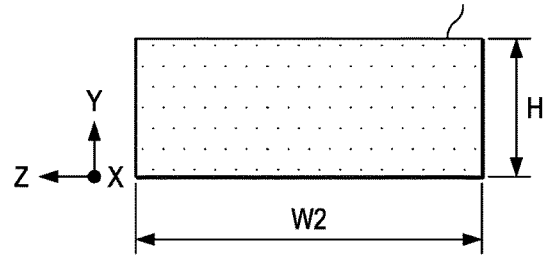

FIGS. 8A-8D illustrate a narrower line and a wider line viewed from the same cutline as FIG. 5B. As shown by FIGS. 8A and 8C, the narrower lines W1 (e.g., 70 nm) will have a dopant concentration that is higher than that of a wider line W2 (e.g., 140 nm) illustrated in FIGS. 8B and 8D. This is due to the differences in volume between the narrower line and the wider line. For example, as shown in FIGS. 8A and 8B, the length (along the x-axis) and height (as measured along the y-axis (top to bottom)) of W1 and W2 are taken to be substantially the same. The schematically illustrated implant process shows zero-degree angle and non-zero-degree angle implants with the same dopant and substantially the same total dose of dopant. As illustrated, the dopant dose for the narrower line having a first width (W1 of FIG. 8A) will penetrate substantially all of the W1 polysilicon resistor body while the dopant dose will be more concentrated in a portions near the side and top surfaces of the W2 polysilicon resistor body, while the center (e.g., center region 131 of FIG. 5C) is expected to have significantly less dopant. As illustrated in FIGS. 8C and 8D, subsequent implant activation anneals, including a damage anneal, cause the dopant to redistribute in the polysilicon resistor W1 and W2 with a higher bulk concentration in the narrower resistor W1 (FIG. 8C) than in the wider resistor W2 (FIG. 8D).

Figure 9:
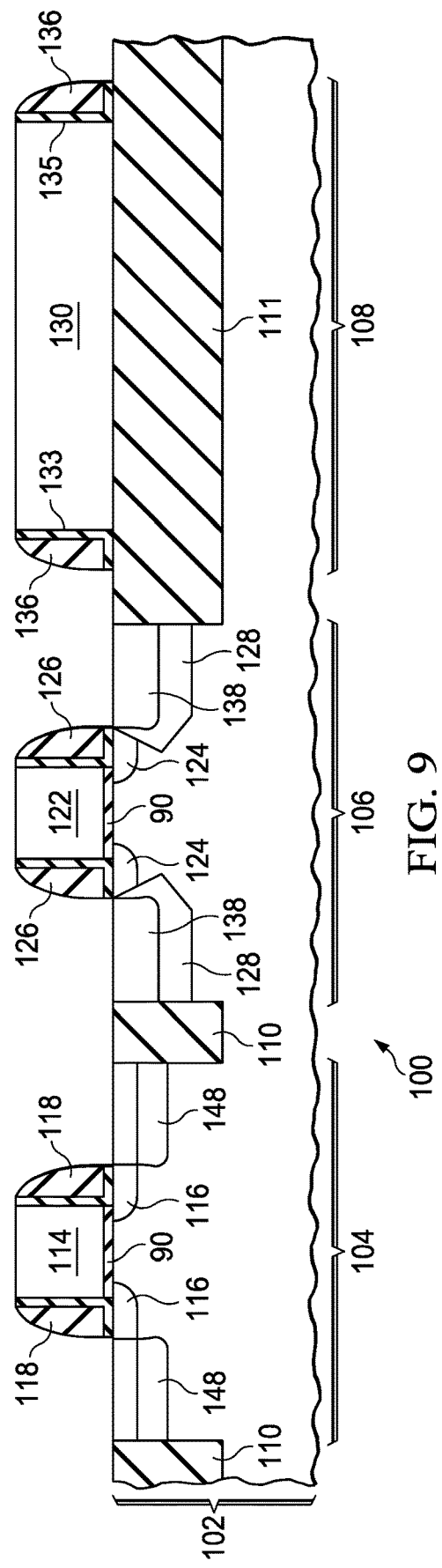
FIG. 9 illustrates an intermediate structure having sidewall spacers, source drain implants, and optional source drain regions.

FIG. 9 shows the addition of sidewall spacers 136 adjacent to the polysilicon resistor body 130 formed over the ZTCR area 108. Gate sidewall spacers 126 adjacent to the polysilicon gate 122 formed over the PMOS area 106 are also added. Gate sidewall spacers 118 adjacent to the polysilicon gate 114 formed over the NMOS area 104 are also added. Optional silicon-germanium (SiGe) epitaxial source/drain regions 128 and p-type source drain (PSD) implanted regions 138 are formed in the substrate 102 in the PMOS area 106. Optional n-type source drain (NSD) implanted regions 148 is formed in substrate 102 in the NMOS area 104.

Figure 10:
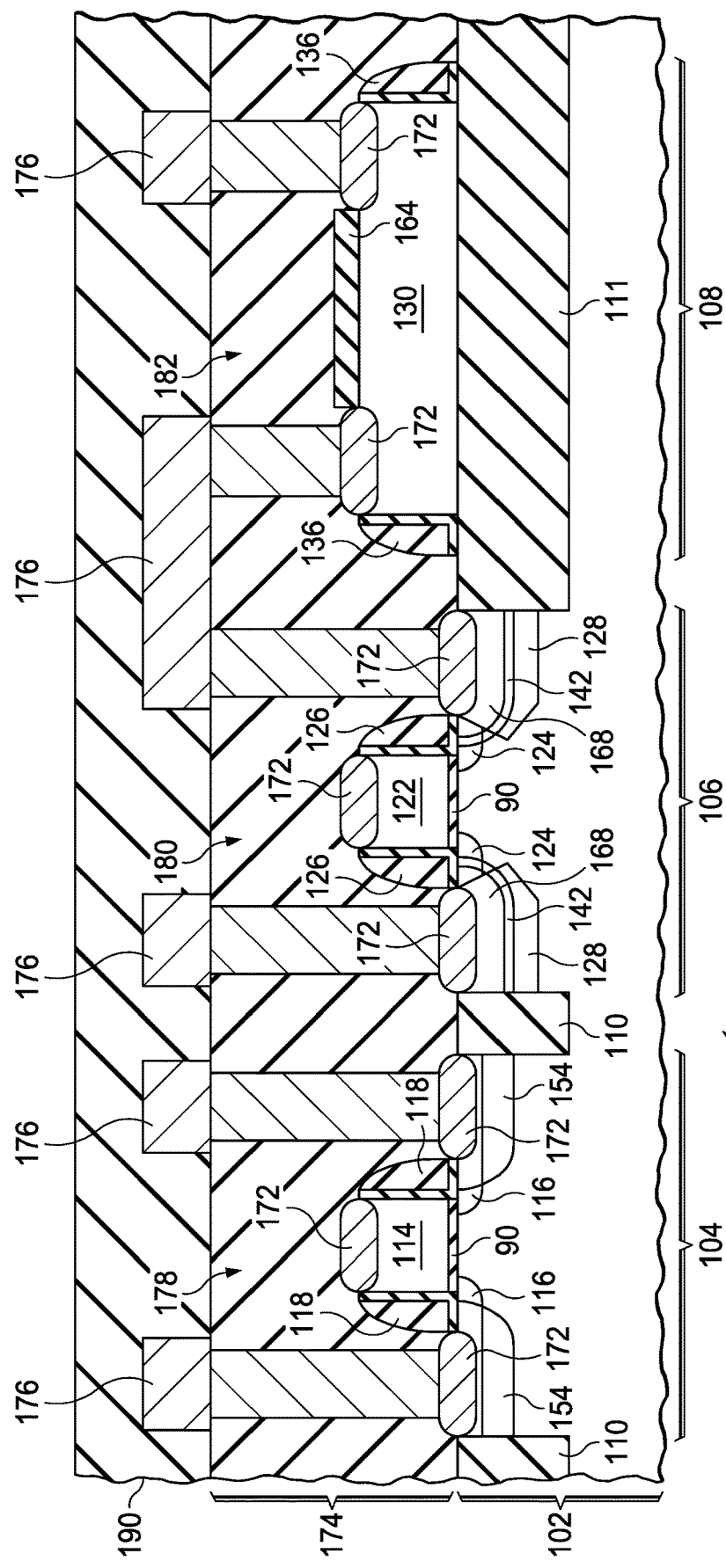
FIG. 10 illustrates an intermediate structure having metal contacts and other material layers formed over the substrate.

FIG. 10 illustrates additional components of the integrated circuit 100. Metal silicide 172 is formed at the top surface of the substrate 102 on NSD regions 154 and first and second PSD regions 142 and 168. Metal silicide 172 is formed at top surfaces of the polysilicon gate 114 in the NMOS area 104 and the polysilicon gate 122 in the PMOS area 106 and at a top surface of the polysilicon resistor body 130 that is not covered by a resistor body silicide block 164 formed over the polysilicon resistor body 130. The metal silicide 172 may be formed, for example, by depositing a layer of metal, such as titanium, cobalt, platinum, tantalum, nickel, palladium or molybdenum on an existing top surface of the integrated circuit 100, heating the integrated circuit 100 to react a portion of the metal with exposed silicon in active areas of the integrated circuit 100, and selectively removing unreacted metal from the integrated circuit 100 surface, by, for example, exposing the integrated circuit 100 to wet etchants including a mixture of an acid and hydrogen peroxide.

A pre-metal dielectric (PMD) layer 174 is formed over an existing top surface of the integrated circuit 100. The PMD layer 174 is a dielectric layer stack including a PMD liner, not shown, a PMD main layer, and an optional PMD cap layer 190. The PMD liner is commonly silicon nitride or silicon dioxide, 10 nm to 100 nm thick, deposited by plasma-enhanced chemical vapor deposition (PECVD) on the existing top surface of the integrated circuit 100. The PMD main layer is commonly a layer of silicon dioxide formed by a HARP process followed by a layer of silicon dioxide, phospho-silicate glass (PSG) or boro-phospho-silicate glass (BPSG), commonly 100 nm to 1 μm thick, deposited by a PECVD process on a top surface of the PMD liner, and sometimes leveled by a chemical-mechanical polish (CMP) process. The optional PMD cap layer is commonly 10 nm to 100 nm of a hard material such as silicon nitride, silicon carbide nitride or silicon carbide, formed on a top surface of the PMD main layer.

Contacts 176 are formed in and over the PMD layer 174 to make electrical contact to the NMOS transistor 178, the PMOS transistor 180 and the ZTCR resistor 182. The contacts 176 may be formed, for example, by defining contact areas on a top surface of the PMD layer 174 with a contact photoresist pattern, etching contact holes in the contact areas by removing PMD layer material using reactive ion etching methods to expose the layers of metal silicide 172, and filling the contact holes with a contact liner metal, such as a dual layer of titanium and titanium nitride, and a contact fill metal, such as tungsten, followed by removal of the contact fill metal and contact liner metal from the top surface of the PMD layer 174 using plasma etching and/or CMP methods.

Figure 11:
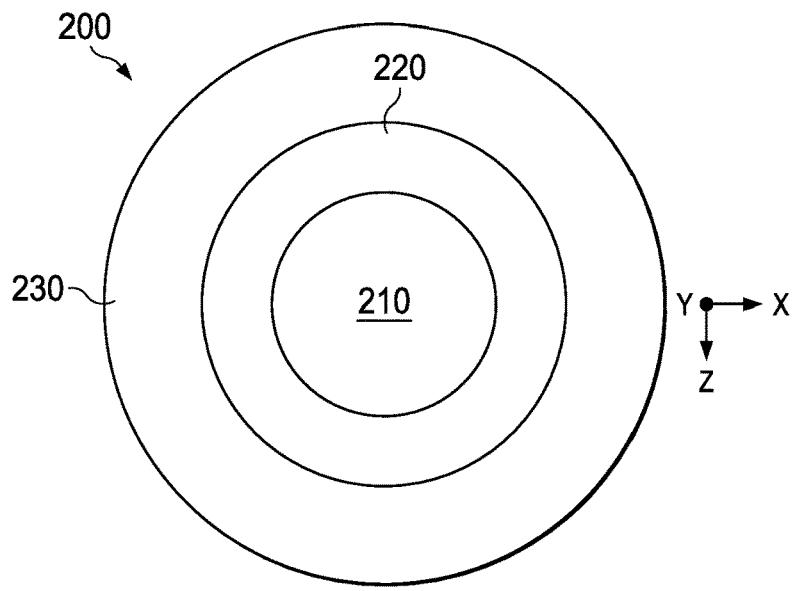
FIG. 11 illustrates a top-down view of a substrate with dopant that is implanted at a zero-degree and/or non-zero-degree angle relative to a surface normal.

FIG. 11 illustrates a top-down view of a substrate 200. Substrate 200 could be a wafer. As illustrated the substrate 200 has dose adjustment patterns that may be obtained using the aspects of the present disclosure. For example, FIG. 11 illustrates a substrate having first, second, and third regions (210, 220, and 230, respectively). The first, second, and third regions are formed by varying the ion implantation angles at a first angle relative to a surface normal, a second ion implantation at a second angle relative to a surface normal, and a third angle relative to a surface normal. For example, the first region 210 is formed from a first ion implantation step conducted at a zero-degree angle. The second region 220 is formed from a second ion implantation step conducted at a non-zero-degree angle of 25°. The third region 230 is formed form a third ion implementation step conducted at a non-zero-degree angle of 45°. It should be noted that the dopant dose of the first, second and third ion implementation steps can be varied. The dopant dose can be varied by changing the speed of the ion implantation across the substrate 200, as taught by U.S. Pat. No. 7,208,330 (Collins et al.), hereby incorporated by reference in its entirety.

The angles of the first, second, and third ion implantation steps can be determined by measuring the width of the polysilicon resistor body 130 (FIG. 5A-5C) in different regions of the substrate 200. This measurement can be performed by a system having a detection system that includes a scatterometer designed to measure the profile of the polysilicon resistor body 130 (FIGS. 5A-5C). Such systems and scatterometers are taught by U.S. Pat. No. 7,208,330 (Collins et al.) supra.

Figure 12A:
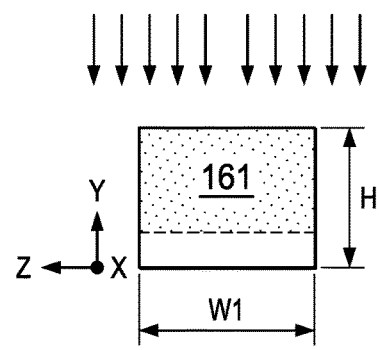
FIGS. 12A-12D illustrate a further and optional amorphizing implant process that implants amorphizing atoms into the polysilicon layer of the resistor area.
Figure 12B:
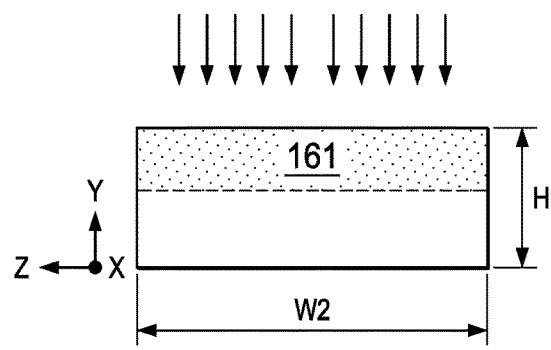
Figure 12C:
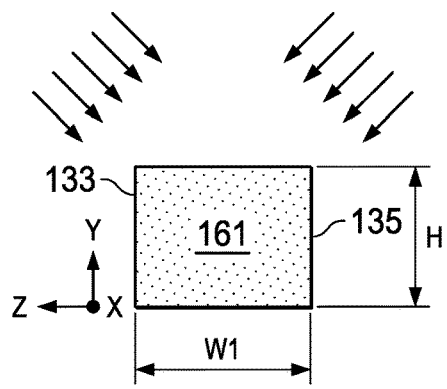
Figure 12D:
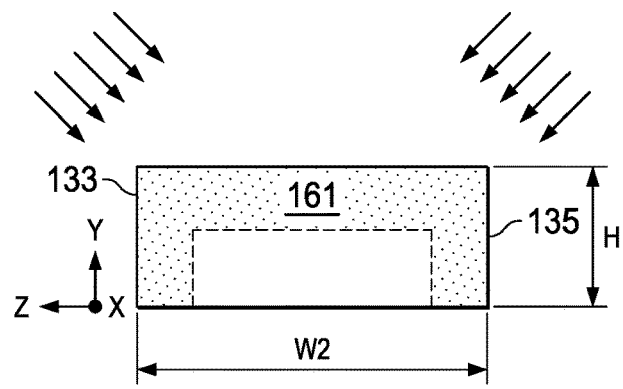

FIGS. 12A-12D illustrate a further and optional amorphizing implant process that implants amorphizing atoms into the polysilicon layer of the ZTCR area 108 (e.g., FIG. 5A) for both narrow and wide lines (12A, 12C and 12B, 12D, respectively) to form partially amorphous regions 161. These figures are again viewed from the cutline of FIG. 5B. The amorphizing implant process illustrated can be performed at both a zero-degree angle relative to the Y axis (FIGS. 12A and 12B) and a non-zero-degree angle (FIGS. 12C and 12D). As illustrated, the zero-degree angle amorphizing implant process amorphizes the topmost surface 131 (e.g., FIG. 5B) of the polysilicon resistor body 130. The non-zero-degree angle amorphizing implant process amorphizes at least the sidewall portions 133 and 135. As a result, the narrower lines W1 (e.g., 70 nm) will have a higher percentage of a partially amorphous region than the wider line W2 (e.g., 140 nm). This is due to the differences in volume between the narrower line and the wider line. For example, as shown in FIGS. 12A through 12D, the dopant and the amount of dopant of the zero-degree angle and the non-zero-degree angle are intended to be substantially the same. Assuming that the length (along the x-axis) and height (as measured along the y-axis (top to bottom)) are all the same, the percentage of amorphous region of the narrower line having a first width (W1 of FIG. 12C) will be higher than the wider line having a second width (W2 of FIG. 12D) due to the surface penetration of the amorphizing implant. As shown in the example, the degree of amorphized region is shown along cross-sectional views below a central portion of the polysilicon resistor bodies (e.g., center region 131a of FIG. 5C). As shown in FIG. 12C, the amorphization is substantially uniform throughout the polysilicon resistor body. While the FIG. 12D structure is shown to not have any dopant in the center of the structure, it is not intended to be limiting.

The amorphizing atoms may be, for example, p-type dopant atoms such as gallium or indium, n-type dopant atoms such as arsenic or antimony, group IV atoms such as silicon or germanium, or inert gas atoms such as argon or xenon. An implant energy of the amorphizing atoms is selected to provide a desired depth of the least partially amorphous layer. A dose of the amorphizing atoms is selected to provide a desired density of lattice vacancies in the at least partially amorphous layer, for example at least vacancies/cm$^3$. In one example, $3 \times 10^{14}$ cm$^{-2}$ silicon atoms may be implanted at 5 keV to form an amorphous layer 20 top 35 Å deep. In another example, $8 \times 10^{13}$ cm$^{-2}$ germanium atoms may be implanted at 20 keV to form the amorphous layer 20 to 35 Å deep. In a further example, $5 \times 10^{13}$ cm$^{-2}$ xenon atoms may be implanted at 20 keV to form the amorphous layer 20 to 35 Å deep. The amorphizing atoms may be blocked from the other active areas 104 and 106 (FIG. 1) by a mask.

It should be noted that the description is not intended to be limiting. For example, while FIGS. 12A-12D depict the zero-degree angle and non-zero-degree angle amorphizing process as two processes, it should be understood to a person of ordinary skill in the art that the step could be performed simultaneously with two or more implanters. Moreover, the zero-degree angle and non-zero-degree angle amorphizing implants could be performed in more than two processes. For example, the zero-degree angle amorphizing implant may be followed by a non-zero-degree angle amorphizing implant that is directed to the first sidewall portion 133 of the polysilicon resistor body 130, which is subsequently followed by another non-zero-degree angle amorphizing implant that is directed to a second sidewall portion 135 of the polysilicon resistor body 130. As discussed above, while the angles of the amorphizing implants shown in FIGS. 12C and 12D appear to be 45° relative to the surface normal of the topmost surface 131 (FIG. 5B), it could be as little as about 1° to as much as about 90° relative to the surface normal. The limiting factor may be the separation between the polysilicon lines on a wafer; for example, a 100 nm separation between lines would allow for a 45° non-zero-degree implantation of the surface normal (FIG. 5B), while a larger separation would allow for a non-zero-degree angle of greater than 45° and a smaller separation would require a non-zero-degree angle of less than 45°. As a result, the non-zero-degree angle could be in the range of about 10° to about 30°, from about 30° to about 60°, and from about 60° to about 90°. In addition, the non-zero-degree angle could be about 25°, about 45°, or about 65°.

Figure 13:
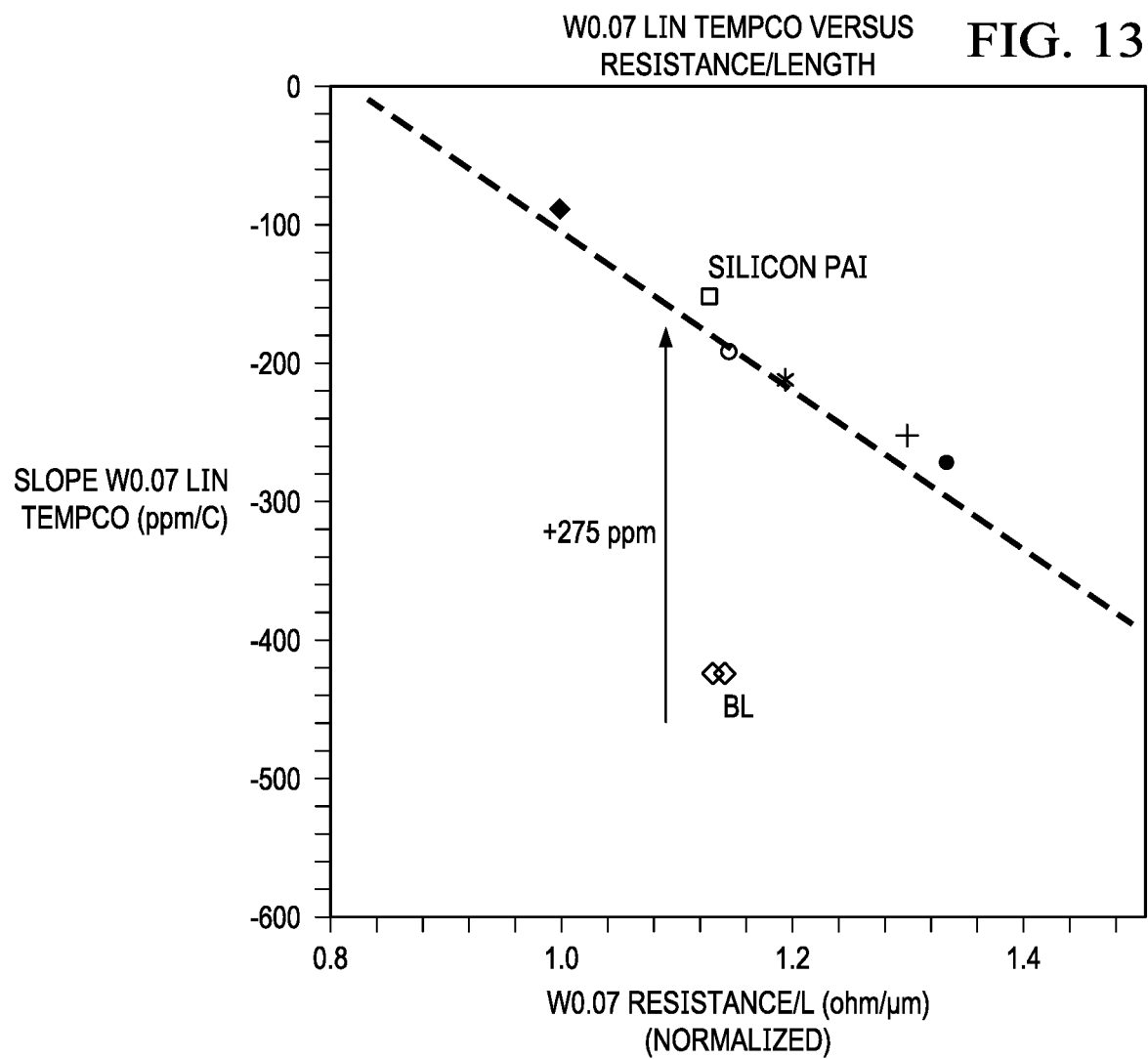
FIG. 13 illustrates the slope of the temperature coefficient (TCR) versus the unit resistance of a narrow line of polysilicon resistors having undergone a non-zero-degree angled amorphizing implant process.

FIG. 13 illustrates the slope of the temperature coefficient (TCR) versus the unit resistance of a narrow line, e.g., 70 nm, of polysilicon resistors having undergone a non-zero-degree angled amorphizing implant process as compared to a baseline resistor (BL) that has not undergone non-zero degree angle amorphizing implant process. As shown, the temperature coefficient of the resistor can be raised to "ideal zero" (see FIG. 6). The resistance can be increased or decreased based on the amount and type of dopant used as well as the energy level, as discussed above. As shown, the temperature coefficient of the resistor having undergone non-zero-degree angle amorphization (silicon PAI) improves by 275 ppm/° C. as compared with the baseline resistor (BL). Without being bound by theory, it is believed that the non-zero-degree angle amorphization step and subsequent heat treatment of the amorphized region results in decreased grain size upon recrystallization, which improves the temperature coefficient. It should be noted that the non-zero-degree angle amorphization step can take place either before or after the zero-degree and non-zero-degree ion implantation discussed above with respect to FIGS. 5A-5C. Combination of the zero and non-zero degree amorphizing implants with the zero and non-zero degree dopant implant can be used to achieve well controlled narrow poly resistors with zero or near zero temperature coefficients.

Figure 14:
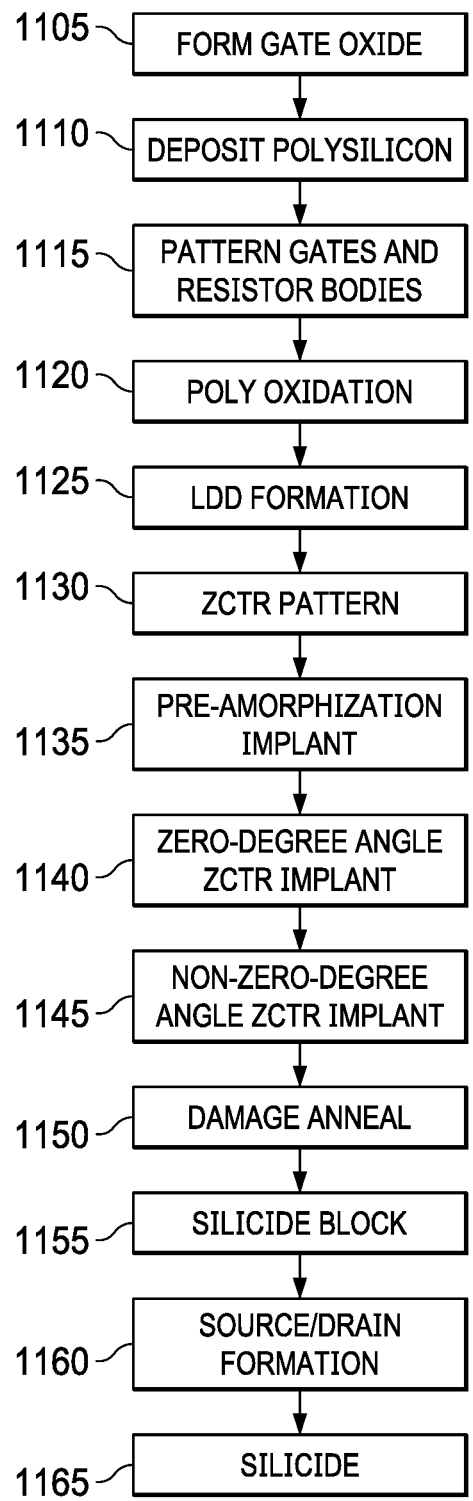
FIG. 14 illustrates a flow diagram depicting one embodiment of a method for manufacturing an integrated circuit.

FIG. 14 illustrates a flow diagram 1100 depicting one embodiment of a method for manufacturing an integrated circuit. In Step 1105, a substrate is provided, and field oxides are formed therein (e.g., FIG. 1). Polysilicon is deposited in Step 1110 (e.g., FIG. 2). The gates and polysilicon resistor body are formed by patterning the polysilicon (e.g., FIG. 3) in Step 115. In Step 1120, the polysilicon is oxidized. In step 1125, lightly doped regions are formed (e.g., FIG. 4). A mask is patterned over the substrate exposing a ZTCR area including a polysilicon resistor body (e.g., FIG. 5A). In step 1135, a non-zero-degree angle pre-amorphization implant is performed. As discussed above, step 1135 could take place before or after the zero/non-zero-degree angled ion implantation (e.g., steps 1140 and 1145). A first ion implantation step is performed in step 1140 that can be a zero-degree angle ion implantation (e.g., FIG. 5A). In step 1145, a second ion implantation is performed at a non-zero-degree angle (e.g., FIG. 5B). In step 1150, an optional damage anneal step is performed. A metal silicide layer is formed over the substrate in step 1155 (e.g., FIG. 10). Contacts to complete the source/drain regions are formed (e.g., FIG. 10) in step 1160. In step 1165, silicide is formed over the substrate (e.g., FIG. 10). It should be noted that step 1165 could be performed before or after step 1160. While the steps have been described in a particular order, it should be noted that the steps can be performed in a variety of orders, as discussed above, or not performed at all.

The above discussion is meant to be illustrative of principles and various examples consistent with the disclosure. Numerous variations and modifications will become apparent to those skilled in the art once the above disclosure is fully appreciated. For example, while the cross-sectional thicknesses of the various layers have been illustrated relative to one another in FIGS. 1-14, they are not intended to be limiting. Different relative thicknesses can be used. Accordingly, it is intended that the following claims be interpreted to embrace all such variations and modifications.

What is claimed is:

1. A semiconductor device, comprising:
   a first polysilicon resistor coupled in an electrical circuit located over a semiconductor substrate, the first polysilicon resistor having a first polysilicon resistor body having a first width and a first sidewall dopant concentration; and
   a second polysilicon resistor coupled in the electrical circuit, the second polysilicon resistor having a second polysilicon resistor body having a second smaller width and a greater second sidewall dopant concentration.

2. The semiconductor device of claim 1, wherein the concentration of dopant in the first and second polysilicon resistor bodies are about equal.

3. The integrated circuit semiconductor device of claim 1, wherein the first and second polysilicon resistors have substantially the same resistance.

4. The semiconductor device of claim 1, wherein the first and second polysilicon resistor bodies further have an amorphizing species implanted therein, the amorphizing species selected from the group consisting of germanium, gallium, indium, argon and xenon.

5. The semiconductor device of claim 4, wherein the concentration of amorphizing species of the second polysilicon resistor body is greater than the concentration of amorphizing species of the first polysilicon resistor body.

6. An integrated circuit, comprising:
   a first polysilicon resistor body having a first width along its short axis and a uniform grain size distribution along the first width;
   a second polysilicon resistor body having a greater second width along its short axis and a nonuniform grain size distribution along the second width.

7. The integrated circuit of claim 6, wherein the second polysilicon resistor body has an interior region with larger grains and an exterior region along a top surface and side surfaces with smaller grains.

8. The integrated circuit of claim 6, wherein the second polysilicon resistor body has an interior region with a first concentration of amorphizing atoms and an exterior region along a top surface and side surfaces with a greater second concentration of amorphizing atoms, the amorphizing atoms selected from the group consisting of germanium, gallium, indium, argon and xenon.

9. The integrated circuit of claim 6, further comprising a transistor having a gate electrode, the gate electrode and the first and second resistor bodies formed from a same polysilicon layer.

10. The integrated circuit of claim 6, further comprising sidewall spacers along sidewalls of the first and second polysilicon resistor bodies.

11. An integrated circuit, comprising:
    a first polysilicon resistor body having a first width along its short axis and a first boron concentration along the first width;
    a second polysilicon resistor body having a lesser second width along its short axis and a greater second boron concentration along the second width.

12. The integrated circuit of claim 11, wherein the first polysilicon resistor body has a nonuniform grain size along the first width, and the second polysilicon resistor body has a uniform grain size along the second width.

13. The integrated circuit of claim 11, further comprising a transistor having a gate electrode, the gate electrode and the first and second resistor bodies formed from a same polysilicon layer.

* * * * *